United States Patent
Bamnolker et al.

(10) Patent No.: US 6,756,315 B1
(45) Date of Patent: Jun. 29, 2004

(54) METHOD OF FORMING CONTACT OPENINGS

(75) Inventors: Hanna Bamnolker, Cupertino, CA (US); Prashant Phatak, Sunnyvale, CA (US); Usha Raghuram, San Jose, CA (US); Sam Geha, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/672,836

(22) Filed: Sep. 29, 2000

(51) Int. Cl.[7] .................... H01L 21/302; H01L 21/461
(52) U.S. Cl. .................... 438/734; 438/700; 438/714
(58) Field of Search .................... 438/734, 756, 438/723, 700, 701, 702, 706–714, 722–732, 906

(56) References Cited

U.S. PATENT DOCUMENTS

| | | | |
|---|---|---|---|
| 5,306,671 A | 4/1994 | Ogawa et al. | 437/225 |
| 5,468,342 A | 11/1995 | Nulty et al. | 156/643.1 |
| 5,523,258 A | 6/1996 | Petti et al. | 437/186 |
| 5,562,801 A | 10/1996 | Nulty | 156/643.1 |
| 5,670,426 A | 9/1997 | Kuo et al. | 437/195 |
| 5,779,925 A * | 7/1998 | Hashimoto et al. | 216/67 |
| 5,817,579 A * | 10/1998 | Ko et al. | 438/740 |
| 5,824,234 A | 10/1998 | Jou et al. | 416/18 |
| 5,861,676 A | 1/1999 | Yen | 257/776 |
| 5,920,796 A * | 7/1999 | Wang et al. | 438/700 |
| 5,953,614 A * | 9/1999 | Liu et al. | 438/303 |
| 5,968,279 A | 10/1999 | MacLeish et al. | 134/12 |
| 5,968,846 A | 10/1999 | Chou et al. | 438/712 |
| 6,004,874 A | 12/1999 | Cleeves | 438/622 |
| 6,022,805 A | 2/2000 | Sumi | 438/677 |
| 6,066,555 A | 5/2000 | Nulty et al. | 438/634 |
| 6,235,640 B1 * | 5/2001 | Ebel et al. | 438/706 |
| 6,277,733 B1 * | 8/2001 | Smith | 438/636 |
| 6,451,703 B1 * | 9/2002 | Liu et al. | 438/710 |

OTHER PUBLICATIONS

H. Sumi et al., "Optimization of Contact Process with Monte Carlo Study for Advanced CMOS Devices", pp. 3–8, Feb. 1996.

* cited by examiner

*Primary Examiner*—Carl Whitehead, Jr.
*Assistant Examiner*—Thanhha S Pham
(74) *Attorney, Agent, or Firm*—Piper Rudnick LLP; Steven B. Kelber

(57) ABSTRACT

The present invention provides a method of forming, in semiconductor substrates, contact openings having low contact resistance. The method involves, in particular, the introduction of a "soft etch" cleaning step that is used to clean the bottom of the contact openings. The "soft etch" cleaning step uses fluorocarbon chemistry. It is shown that the resulting resistance of the contact openings is reduced.

25 Claims, 5 Drawing Sheets

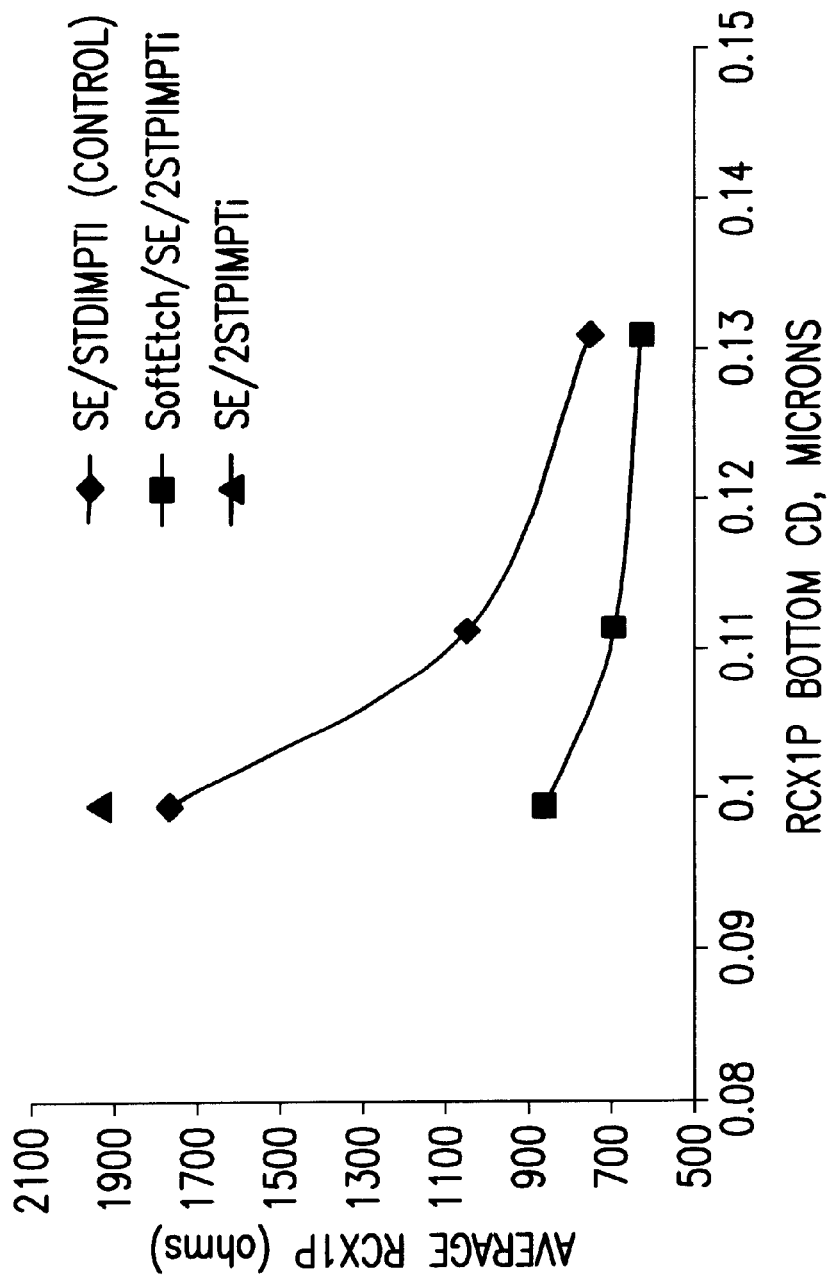

METHOD OF FORMING CONTACT OPENINGS

BACKGROUND OF THE INVENTION

1. Field of the Invention

The present invention relates generally to the manufacture of semiconductor devices and, more particularly, to a method of forming a contact hole to an active or electrically functional region of a semiconductor device.

2. Discussion of the Background

During the semiconductor fabrication process, multiple conductive layers such as metal and/or polysilicon layers are often deposited on a semiconductor wafer or substrate, which is typically made of silicon. Conductive layers are sometimes separated from each other by an insulating dielectric layer including one or more materials such as silicon dioxide and/or silicon nitride. These conductive layers are selectively connected or "wired" together to allow for conduction of electricity in a desired pattern.

Semiconductor devices perform their functions only after they have been interconnected in a prescribed manner. To accomplish this, typically contact openings or holes are opened (e.g., etched) in the dielectric layers. Electrically conductive materials (e.g., metals) later deposited into these holes form "contacts," "plugs" or "vias" (hereinafter referred to as "contacts") that contact the source, drain and gate regions of transistors to overlying conductors, for example.

The formation of contact holes in the oxide that covers the substrate surface is a key step in the fabrication of interconnect structures. The process typically starts by etching the oxide through the openings that are patterned on a mask that is formed on the oxide layer. Usually, a photoresist serves as a mask, as is well known in the art. Subsequently, the photoresist is removed.

Oxide materials are principally used for electrically insulating layers. "Oxide" is a somewhat generic term used for silica, particularly silicon dioxide ($SiO_2$). Because of the limits set by dielectric breakdown, the thickness of the oxide layers cannot be reduced to much below 0.5 to 1.0 micrometers. The minimum feature size of contact holes penetrating the oxide layer, however, is being pushed to below 0.1 micrometers. The result is that the holes etched in the oxide must be highly vertical and must have a high aspect ratio (i.e., ratio of the depth of the hole to the minimum width of the hole).

During formation of the contact openings, contaminants and impurities often form on the silicon surface of the wafer. Sometimes, because of the increasingly small size of the holes and/or the high aspect ratio of the holes, it is difficult to clean the bottoms of the holes subsequent to etching. The presence of contaminants and impurities contributes significantly to high contact resistance because the contaminants and impurities act as insulators between the substrate surface and the metal that is to be later deposited into the hole. Moreover, for a given substrate and a given material contacting the substrate, the contact resistance increases as a function of the contact area. The area available for forming self-aligned contacts is generally limited by the distance between adjacent transistor gates, which is minimized in order to minimize chip size and maximize transistor density. Therefore, maximizing the cleanliness (and thus the area) of the substrate surface available for formation of self-aligned contacts is particularly critical to maximizing performance of devices containing such contacts. High contact resistance, in turn, adversely affects the performance of the semiconductor device. The surface of a semiconductor substrate, therefore, must be cleaned in order to manufacture a highly reliable, high performance semiconductor device.

Sputtering is a process that may result in the physical removal of surface material. Conventional technology relies on a sputtering step to clean the contact openings after the contact holes are etched. In a typical sputter etch, chemically inert ions such as argon ($Ar^+$) or xenon ($Xe^+$) are accelerated toward the wafer or substrate and physically eject the contaminants and impurities from the surface at the bottom of the contact openings.

Conventional sputter etching processes for cleaning contact openings have several disadvantages. First, sputtering is generally non-selective, and high-energy sputtering may seriously degrade the silicon exposed at the bottom of the etched contact opening. Moreover, sputter etching is not always effective in cleaning the contact openings, and the contact surface of the opening may be compromised because of insufficient cleaning of the bottom of the opening. In addition, the increasingly small sizes and high aspect ratios of the contact openings make it difficult for the $Ar^+$ or $Xe^+$ ions to get into the opening and even more difficult for the contaminants and impurities to be physically ejected from the bottom thereof.

In view of the aforementioned deficiencies attendant with the prior art methods, it is clear that a need exists for a method of forming contact openings that overcomes such deficiencies.

SUMMARY OF THE INVENTION

One object of the present invention is to provide a method of forming contact openings.

Another object of the invention is to reduce the contact resistance in contact openings in semiconductor devices.

Yet another object of the present invention is to improve the cleanliness of the surface to be contacted.

The above and other objects, advantages and features of the present invention will become more apparent from the following detailed description of the presently preferred embodiments, when considered in conjunction with the drawings, and to the appended claims.

BRIEF DESCRIPTION OF THE DRAWINGS

FIG. 5 is a graph depicting, in p-doped silicon, the contact resistance of a contact opening formed according to the present invention and the contact resistance of a control contact opening.

DESCRIPTION OF THE PREFERRED EMBODIMENTS

To achieve the foregoing and other objects, and in accordance with the purpose of the present invention as embodied and broadly described herein, the present invention relates to a method of forming an interconnect, such as a contact opening, to a region of a semiconductor device. The method of forming contact openings according to the present invention involves a cleaning process that depends primarily upon chemical etch effects rather than physical (i.e., bombardment) effects. The method comprises first forming contact holes in an oxide layer that covers the substrate surface by employing conventional methods, followed by the inventive "soft etch" cleaning step of the present invention.

The method of forming a contact opening in a semiconductor device according to the present invention will now be described in more detail. In the following description, numerous details are set forth, such as the use of photoresist or the use of a self-aligned contact etch. It will be apparent to one skilled in the art, however, that the present invention may be practiced other than as specifically described herein. In other instances, well-known structures and processes have not been set forth in detail to avoid obscuring the present invention.

Figure 1:
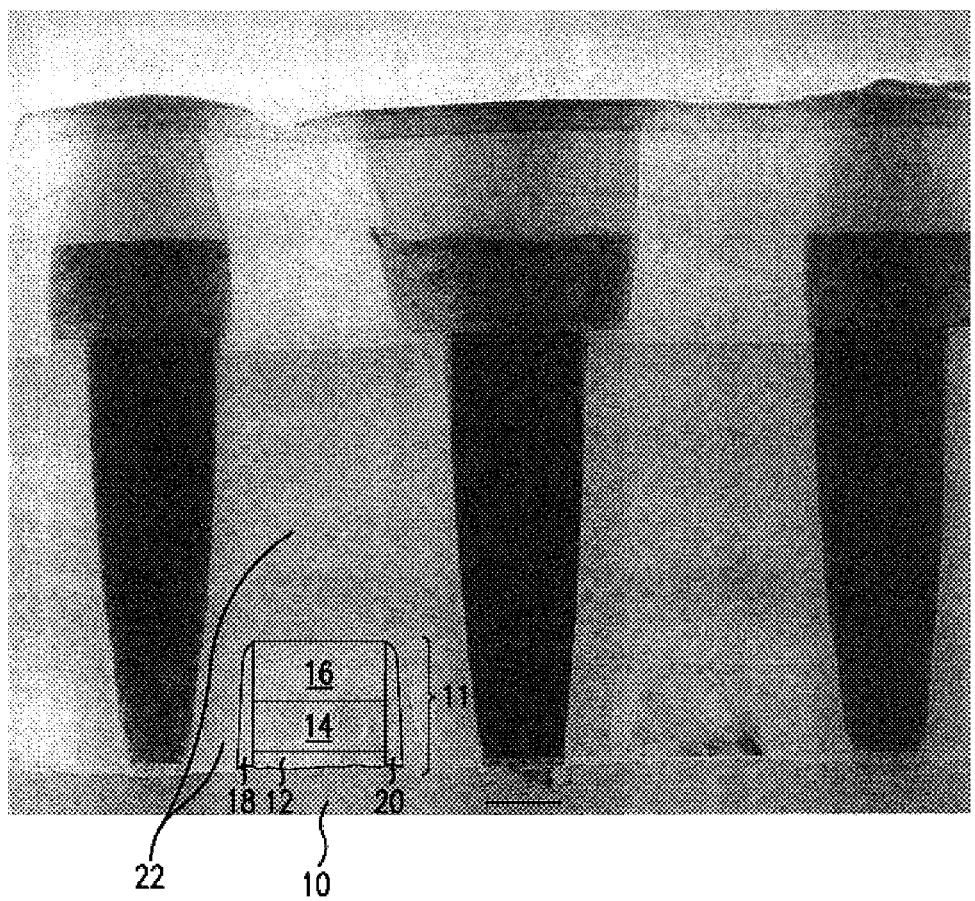
FIG. 1 illustrates the layers formed during the processing of a typical semiconductor device.

FIG. 1 illustrates a cross-sectional view of a layer stack representing the layers formed during the processing of a typical semiconductor transistor structure, e.g., one that may be employed to fabricate integrated circuits or the like. It should be noted that other additional layers above, below or between the layers shown may be present. Further, not all the layers shown need necessarily be present, and some or all may be substituted by different layers.

In FIG. 1, at the bottom of the layer stack, there is shown a substrate 10, typically composed of silicon. A gate oxide layer 12, typically comprising silicon dioxide (e.g., $SiO_2$), which may be doped with one or more conventional dielectric dopants (such as phosphorous and/or boron and which preferably comprises from about 1 to about 15% of phosphorous and from 0 to about 10% of boron, more preferably from about 5 to about 11% phosphorous and from 0 to about 5% boron), is formed above substrate 10. As noted above, additional layers may be present. For example, two such layers are a polysilicon layer 14, which may be deposited over gate oxide layer 12, and a silicon nitride (e.g., $Si_3N_4$) layer 16, which may be deposited over polysilicon layer 14. On each side may be found spacers 18 and 20, which are typically made of silicon nitride. Together, gate oxide layer 12, polysilicon layer 14, silicon nitride layer 16 and spacers 18 and 20 comprise gate module 11. One or more barrier layers (not shown) typically formed of Ti, TiN, TaN, TiW or other suitable barrier materials may also be present. A thick layer of polysilicate glass ("PSG") 22 is deposited such that gate module 11 is buried within the layer of PSG. PSG layer 22 is to be etched to form a contact, preferably a self-aligned contact, through to substrate 10.

The layers are readily recognizable to those skilled in the art and may be formed using any of a number of suitable and known deposition processes including, for example, chemical vapor deposition (CVD), plasma-enhanced chemical vapor deposition (PECVD) and physical vapor deposition (PVD).

To form the aforementioned contact openings, a portion of the layers are etched using, for example, a suitable plasma source. The process generally involves depositing and patterning a photoresist layer and developing the photoresist material to form a mask to facilitate subsequent etching, wherein the photoresist pattern covers areas of the layer stack that are not to be etched. A subsequent oxide etching step etches a contact opening through the exposed areas of the oxide layer.

In the etching step, an opening to the substrate region is formed by conventional methods known to those of ordinary skill in the art. For example, the areas of the layer stack that are unprotected by the mask are etched away, leaving behind contact openings. Where these unprotected areas overlap with one or more sidewall spacers or cap dielectric layers, a self-aligned contact is formed. In such a case, one selects an etchant chemistry and/or etching conditions that selectively etch the oxide layer at a faster rate than the sidewall spacers or cap dielectric layer, as is known in the art. Self-aligned contact etch technology is well-known and is described in, for example, U.S. Pat. Nos. 6,066,555; 5,861,676; 5,562,801; 5,523,258; and 5,468,342; U.S. patent application Ser. Nos. 09/593,968 filed Jun. 15, 2000; Ser. No. 09/593,967 filed Jun. 15, 2000; Ser No. 09/561,292 filed Apr. 28, 2000; Ser. No. 09/491,044 filed Jan. 25, 2000; Ser. No. 09/405,945 filed Sep. 27, 1999; Ser. No. 09/326,432 filed Jun. 4, 1999; Ser. No. 09/300,817 filed Apr. 27, 1999; Ser. No. 09/253,991 filed Feb. 22, 1999; Ser. No. 09/143,723 filed Aug. 31, 1998; Ser. No. 09/006,958 filed Jan. 14, 1998; and U.S. Provisional Patent Application Serial No. 60/079,319 filed Mar. 25, 1998, the relevant portions of each of which are incorporated herein by reference.

Following the contact etch, any residual photoresist on the layer stack may: then be stripped or removed by conventional wet or dry stripping. Dry stripping may be conducted with, for example, a plasma etcher. In such a device, oxygen ($O_2$) is introduced into a plasma that dissociates the $O_2$ into various oxygen radicals and ion species that oxidize, or "ash", the photoresist.

Next, the layer stack may then be exposed to one or more wet cleaning processes. One such process (typically where more than one process is employed) is sometimes referred to as "superclean 1" or "SC1" and comprises immersing one or more wafers into a mixture of ammonium hydroxide, a peroxide such as $H_2O_2$ and water for a period of time sufficient to remove one or more undesirable materials (e.g., residual photoresist particles, etc.) from the wafer(s). The second cleaning process is very similar to the first, but generally involves a mixture of sulfuric acid and a peroxide such as $H_2O_2$ (a so-called "piranha" solution).

After the wet cleaning, an optional alloying step may be conducted wherein the wafer is annealed in a nitrogen ($N_2$) ambient at high temperatures (about 425° C.).

The inventive cleaning step of the present invention is then conducted. It involves a "soft etch" step that removes contaminants, impurities and undesirable materials, etc. (collectively referred to as "contaminants") from the bottom of the contact openings more effectively than conventional physical etching. The "soft etch" step comprises exposing the bottom of the contact opening to a chemical etchant such that it selectively etches contaminants, impurities and/or other undesirable materials resulting from previous processing steps without significantly etching the silicon at the surface of the wafer, thereby cleaning the bottom of the contact opening. The chemical etchant preferably comprises, as the active ingredient, a fluorocarbon (e.g., $C_xF_y$, wherein x is from 1 to 4, preferably 1 or 2, and y is 2x or 2x±2, but is at least 4, and is preferably 2x+2) in a suitable carrier gas such as Ar, nitrogen or helium (He). The preferred fluorocarbon is $C_2F_6$. The rate of total flow (i.e., for fluorocarbon and carrier) is from about 100 sccm to about 300 sccm. The soft etch may be done at high pressures, preferably from about 100 mTorr to about 1500 mTorr. The high pressures provide a more chemical etch and result in less surface damage, as well as excellent etch uniformity. The power is in the range of about 70 watts to about 400 watts.

The "soft etch" cleaning step according to the present invention is preferably performed in the absence of oxygen, thereby preventing any undercut into the PSG layer. Furthermore, there is only gentle directional bombardment of the substrate in the "soft etch" cleaning step because the "soft etch" cleaning step is essentially a chemical etch, with some minor ion assistance, that generally may rely on chemical reactions to convert solid contaminant material at the bottom of the contact openings (e.g., $SiO_2$) to a vaporizable material (e.g., silicon (oxy)fluorides and $CO_x$) to clean the contact openings. The chemical nature of the "soft etch" cleaning step is believed to facilitate removal of material from the bottoms of small and/or high aspect ratio contact openings (e.g., a size≦0.15 micrometers and/or an aspect ratio≧4).

The contact openings cleaned by the "soft etch" cleaning step of the present invention provide contacts having relatively low resistance. The effect is even more dramatic for self-aligned contact openings.

The process of the present invention, unlike the prior art, does not depend on a sputter etch to clean the contact openings. If desired, however, a sputter etch cleaning step may follow the "soft etch" cleaning step, but a sputter etch clean is not necessary.

Alternatively, the "soft etch" cleaning step of the present invention could be performed after the wet clean step and before the alloy step.

After the "soft etch" cleaning step, or the sputter etch (if used), a liner and/or barrier may be deposited by conventional processes. Typically, a liner layer, which is the contact to the silicon substrate, is deposited into the contact opening, followed by a separate barrier layer. Any conventional liner and/or barrier material is suitable for use in the present invention; however, titanium (Ti) is a preferred liner layer, and titanium nitride (e.g., TiN and/or $Ti_3N_4$) is a preferred barrier layer. The bulk conductor for the contact may comprise Mo, W, Al, Cu or a conventional alloy thereof, but is preferably Cu or an Al—Cu alloy (preferably one containing about 0.1 to about 4.0 mol % Cu).

The process of the present invention may be performed in any of the known processing apparatuses, including those adapted for dry etching, plasma etching, reactive ion: etching, magnetically enhanced reactive ion etching or the like. To further elaborate, in a typical processing chamber adapted for dry etching, the semiconductor wafer or substrate is exposed to the plasma. The chamber includes an inlet port through which etchant source gases are supplied to the chamber interior. A suitable RF energy source is applied to electrodes associated with the chamber to induce formation of the plasma. The energy itself may be coupled inductively or capacitively to sustain the plasma, as is known in the art. Reactive species are then formed from the etchant gas source to etch away (preferably, selectively) at one or more exposed layers of the wafer. The volatile by-products are then exhausted through an exit port.

Plasma etching relates to the situation where the wafer is positioned on the anode, or ground electrode, during wafer processing. On the other hand, reactive ion etching relates to the situation where the wafer is positioned on the cathode, or powered electrode, during processing. Magnetically enhanced reactive ion etching represents a variant of the reactive ion etching apparatus wherein a magnetic field is applied to reduce the loss of energetic electrons to the reactor wall surfaces.

It is contemplated that the invention may be practiced in any of the above reactors, as well as other suitable plasma processing reactors. Note that the above is true irrespective of whether energy to the plasma is delivered through capacitively coupled parallel electrode plates, through electron resonance microwave plasma sources or through inductively coupled RF sources such as helicon, helical resonators and transformer coupled plasma.

In a preferred embodiment, the present invention applies a capacitively coupled plasma, rather than an inductively coupled plasma. More preferably, the "soft etch" cleaning step is performed in a LAM RAINBOW® 4420 etcher, which is available from Lam Research Corporation of Fremont, Calif. As mentioned above, however, any other conventional and suitable plasma processing systems may be employed.

The invention will now be described by reference to the following detailed example. The example is set forth by way of illustration and is not intended to be limiting in scope.

EXAMPLE

Contact openings were formed in a control substrate using conventional methods in a LAM RAINBOW® 4420 etcher machine. In particular, the openings were formed using a self-aligned contact etch, followed by an ash process to strip the photoresist, two wet cleans, an alloy process and a sputter etch. Following the sputter etch, a standard ion metal plasma Ti liner was deposited into the self-aligned contact openings and was patterned to form an interconnect layer.

The contact openings were formed in a substrate having both n-doped and p-doped silicon thereon in the same manner as done for the control, except that the contact openings were cleaned with the "soft etch" cleaning step of the present invention prior to the conventional sputter etch clean. For the "soft etch" cleaning step, an etchant comprising from about 30 to about 90 sccm $C_2F_6$ (preferably about 90 sccm) and about 140 sccm He was fed into the etching chamber. The pressure in the chamber was kept at a value of from about 300 to about 900 mTorr, and the power was from about 200 to about 400 watts. The plasma was struck, and the contact openings were exposed to the plasma for about 6 seconds. Following the "soft etch" cleaning step, the substrate was sputter etched and then a two-step liner was deposited where about 50 Angstroms of non-ionized metal plasma Ti was first deposited, followed by about 350 Angstroms of Ti by ionized metal plasma ("IMPTi").

Figure 2:
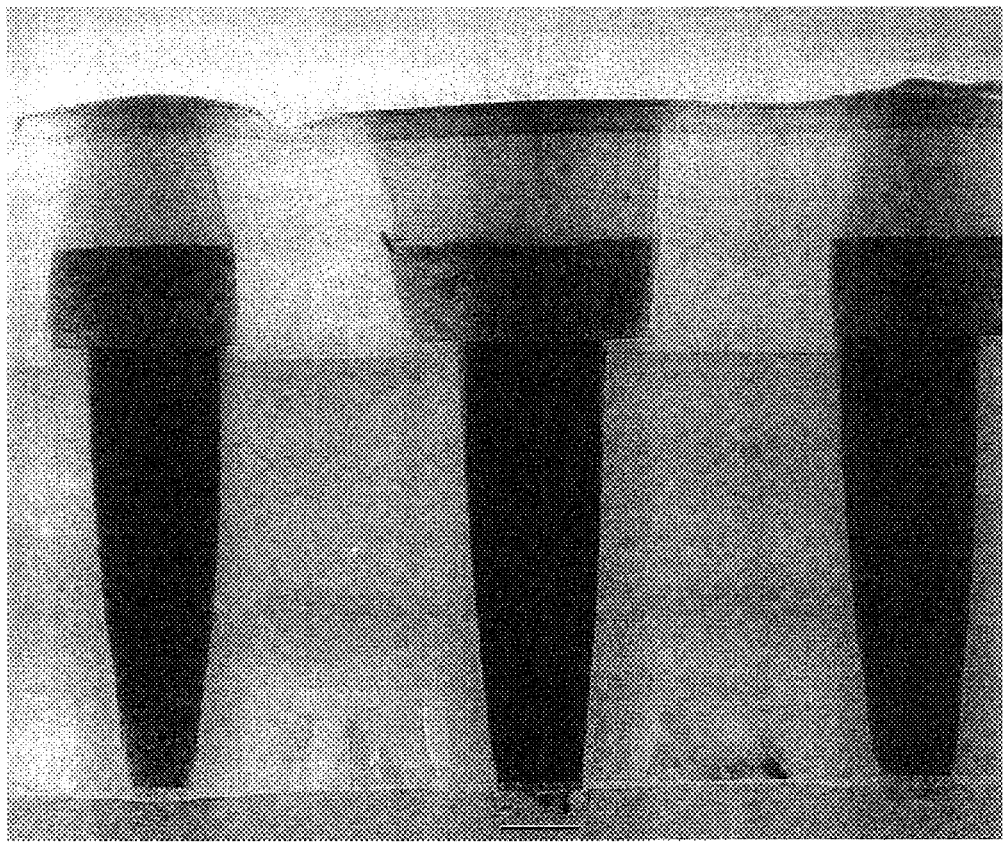
FIG. 2 is a transmission electron microscope (TEM) picture showing contact openings formed according to the present invention.
Figure 3:
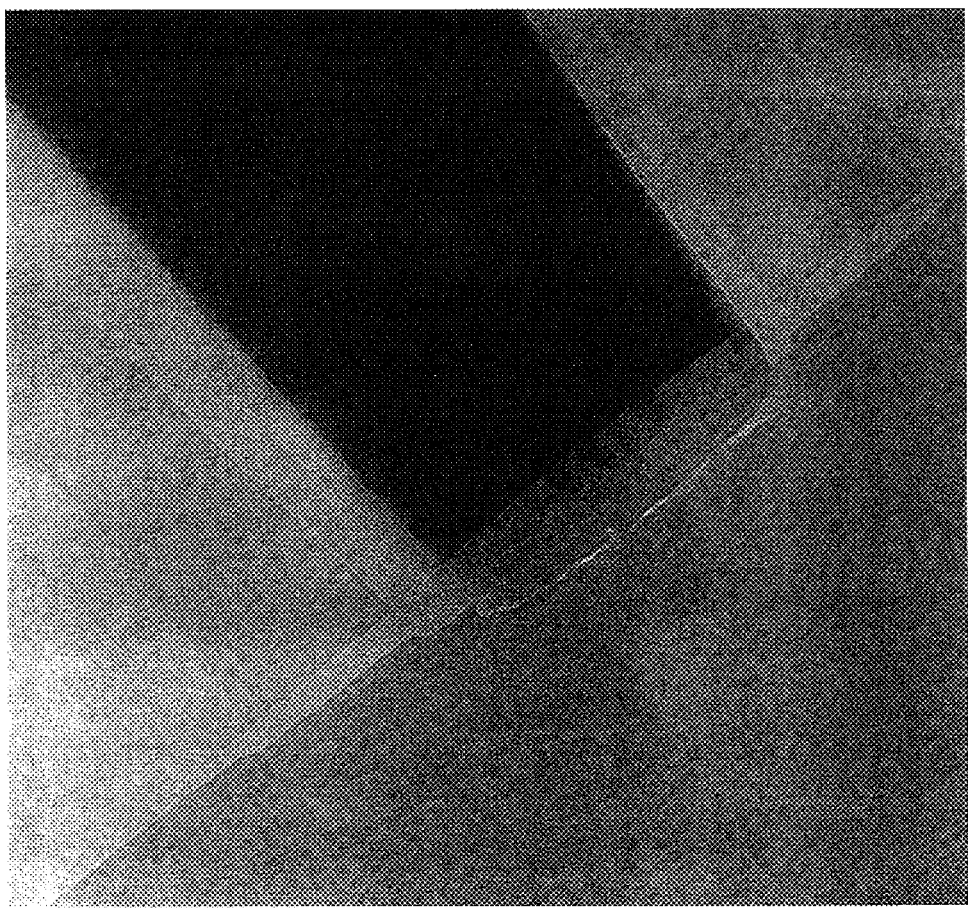
FIG. 3 is a transmission electron microscope (TEM) picture showing a contact opening formed according to conventional methods.

As seen in FIGS. 2 and 3, the soft etch of the present invention is more effective than prior art methods in cleaning residues from the bottom of contact openings. FIG. 3 is a picture from a transmission electron microscope showing a contact formed according to conventional methods. As seen therein, a white residue remains at the bottom of the contact opening, indicating an incomplete cleaning by the sputter etch cleaning step in the absence of the "soft etch" cleaning step of the present invention. FIG. 2 shows contacts formed in openings cleaned according to the present invention. No residue is seen at the bottoms of the contacts, thereby indicating that the "soft etch" cleaning step of the present invention effectively cleans the bottoms of the contact openings.

Figure 4:
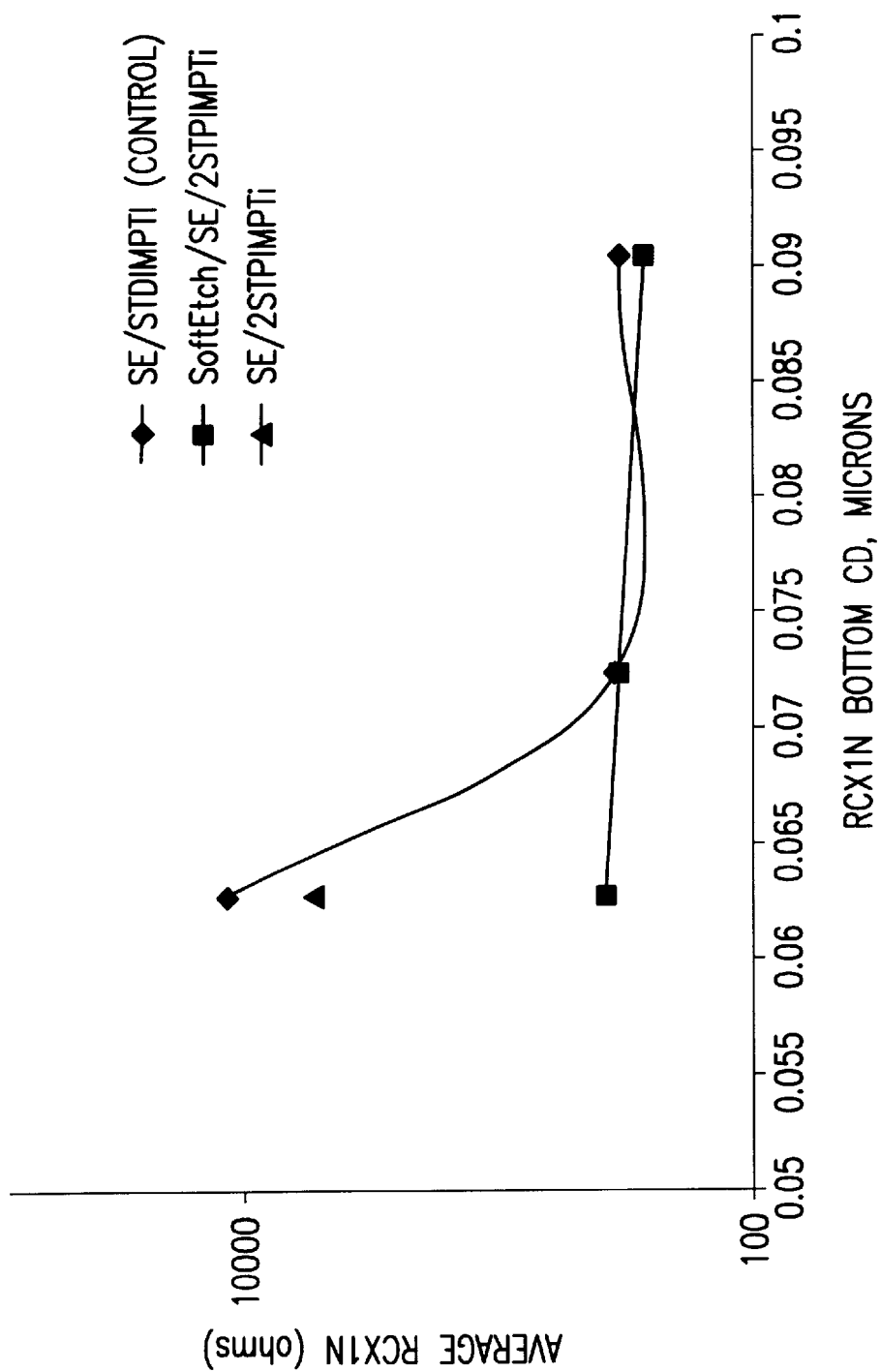
FIG. 4 is a graph depicting, in n-doped silicon, the contact resistance of a contact opening formed according to the present invention and the contact resistance of a control contact opening.

In FIGS. 4 and 5, the term "RCX1N" refers to the contact resistance of the self-aligned contact of the n-doped silicon substrate, and the term "RCX1P" refers to the contact resistance of the self-aligned contact of the p-doped silicon substrate. The term "CD" refers to the critical dimension, or sidewall-to-sidewall measurement, of the bottom of the contact openings. The contact resistance in FIGS. 4 and 5 is per contact and is calculated by measuring the contact resistance of a chain of contacts (approximately 10,000 contacts in series) and dividing the resistance of the chain by the number of contacts in the chain.

As indicated in FIGS. 4 and 5, the cleaner contact openings results in much lower contact resistance. FIGS. 4 and 5 show that the resistance of the contacts formed in openings cleaned by the present cleaning method is significantly less than the resistance of the contacts formed in openings cleaned by a conventional sputter etch. The inventive "soft etch" cleaning step effectively cleans the bottom of small diameter and/or high aspect ratio contact openings, thereby reducing the resistance of contacts formed therein, particularly when the contact openings have a maximum diameter of <0.15 micrometers, preferably ≦0.10 micrometers and more preferably ≦0.07 micrometers. As indicated on the graphs, the different liner deposition process following the "soft etch" cleaning step is not the cause of the improved contact resistance seen in accordance with the present invention.

Having now fully described the invention with reference to certain representative embodiments and details, it will be apparent to one of ordinary skill in the art that changes and modifications can be made thereto without departing from the spirit or scope of the invention as set forth herein.

What is claimed is:

1. A method of forming a contact opening, comprising the sequential steps of:
   etching an opening in an oxide layer over a substrate;
   cleaning the opening in the oxide layer and the substrate with a wet cleaning process; and
   exposing the opening to a substantially oxygen free plasma comprising, as the sole chemical etchant component thereof, one or more fluorocarbons each of which consists of fluorine and carbon atoms, to remove at least some contaminant from the bottom of the opening.

2. The method of claim 1, wherein the substrate comprises silicon.

3. The method of claim 1, wherein the fluorocarbon etchant comprises a compound of the formula $C_xF_y$, where x is from 1 to 4, y is 2x−2, 2x or 2x+2 and y is greater than or equal to 4.

4. The method of claim 3, wherein the fluorocarbon etchant comprises $C_2F_6$.

5. The method of claim 1, wherein the exposing step is carried out at a pressure of from about 100 mTorr to about 1500 mTorr.

6. The method of claim 1, wherein the opening has a diameter that is less than or equal to about 0.15 micrometers.

7. The method of claim 1, wherein the opening has an aspect ratio that is greater than or equal to about 4.

8. The method of claim 1, further comprising, after said exposing step, depositing a conductive material into said contact opening.

9. The method of claim 1, further comprising, after said exposing step, cleaning said opening and said substrate by sputter etching.

10. The method of claim 1, wherein one or more gates are disposed on the substrate, each of the one or more gates encapsulated by spacers and a cap, and wherein the step of etching an opening in an oxide layer exposes a spacer or a cap of at least one of the one or more gates.

11. The method of claim 1, wherein said plasma in said exposing step comprises a capacitively coupled plasma.

12. A method of forming a contact, comprising the sequential steps of:
   etching an opening in an oxide layer, the oxide layer being in contact with a substrate of a device;
   cleaning the opening in the oxide layer and the substrate of the device with at least one of a wet cleaning and a stripping composition;
   exposing the opening to a substantially oxygen free plasma comprising, as the sole chemical etchant component thereof, one or more fluorocarbons each of which consists of fluorine and carbon atoms, to remove at least some contaminants from a bottom of the opening; and
   depositing a conductive material into said opening, thus forming a contact.

13. The method of claim 12, wherein the substrate comprises silicon.

14. The method of claim 13, wherein the opening has a diameter that is less than or equal to about 0.15 micrometers.

15. The method of claim 13, wherein the opening has an aspect ratio that is greater than or equal to about 4.

16. The method of claim 12, further comprising sputter etching said substrate exposed in the opening after said exposing step.

17. The method of claim 12, wherein the plasma comprises an inductive coupled plasma.

18. The method of claim 12, wherein the plasma comprises a capacitive coupled plasma.

19. The method of claim 12, wherein one or more gates are disposed on the substrate, each of the one or more gates encapsulated by spacers and a cap, and wherein the step of etching an opening in an oxide layer exposes a spacer or a cap of at least one of the one or more gates.

20. A method of forming a contact opening, comprising the sequential steps of:
   etching an opening in an oxide layer over a substrate;
   cleaning the opening in the oxide layer and the substrate with at least one of a wet cleaning and a stripping composition; and
   exposing the entire opening created in the etching step to a plasma comprising a fluorocarbon etchant and a carrier gas, wherein the plasma is substantially free of oxygen and hydrogen containing species, to remove at least some contaminants from a bottom of the opening to form the contact opening.

21. The method of claim 20, wherein the opening has a diameter that is less than or equal to about 0.15 micrometers.

22. The method of claim 20, wherein the opening has an aspect ratio that is greater than or equal to about 4.

23. A method of forming a contact opening comprising the steps of:
   etching an opening in an oxide layer over a substrate, the opening having a width no greater than about 0.15 micrometers;
   cleaning the opening with at least one of a wet cleaning and a stripping composition; and
   exposing the opening to a substantially oxygen free plasma comprising a carrier gas and, as the sole chemical etchant component thereof, one or more fluorocarbons each of which consists of fluorine and carbon atoms.

24. A method of forming a contact opening comprising the steps of:
   etching an opening in an oxide layer over a substrate, the opening having an aspect ratio of at least about 4;

cleaning the opening with at least one of a wet cleaning and a stripping composition; and exposing the opening to a substantially oxygen free plasma comprising a carrier gas and, as the sole chemical etchant component thereof, one or more fluorocarbons each of which consists of fluorine and carbon atoms, to remove at least some contaminants from a bottom of the opening.

25. A method of forming a contact opening comprising the sequential steps of:

etching an opening in an oxide layer formed over a substrate to expose a bottom surface;

cleaning the bottom surface using at least one of a wet cleaning process and a dry cleaning process; and exposing the opening to a plasma to remove at least some contaminants from the bottom surface, the plasma being substantially free from oxygen and hydrogen, the plasma comprising a carrier gas and one or more fluorocarbons, each of which consists of fluorine and carbon atoms;

wherein the opening has an aspect ratio of at least about 4 and a width no greater than about 0.15 micrometers.

* * * * *